United States Patent

Ogawa

(10) Patent No.: US 11,250,912 B2
(45) Date of Patent: Feb. 15, 2022

(54) SEMICONDUCTOR STORAGE DEVICE

(71) Applicant: KIOXIA CORPORATION, Tokyo (JP)

(72) Inventor: Takaya Ogawa, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/805,369

(22) Filed: Feb. 28, 2020

(65) Prior Publication Data

US 2021/0082511 A1 Mar. 18, 2021

(30) Foreign Application Priority Data

Sep. 13, 2019 (JP) .............................. JP2019-166825

(51) Int. Cl.
*G11C 16/04* (2006.01)
*G11C 16/10* (2006.01)
*H01L 27/11582* (2017.01)
*H01L 27/11556* (2017.01)
*G11C 16/26* (2006.01)

(52) U.S. Cl.
CPC .......... *G11C 16/10* (2013.01); *G11C 16/0483* (2013.01); *G11C 16/26* (2013.01); *H01L 27/11556* (2013.01); *H01L 27/11582* (2013.01)

(58) Field of Classification Search
CPC ..... G11C 16/10; G11C 16/0483; G11C 16/26; H01L 27/11556; H01L 27/11582
USPC ....................................................... 365/185.18
See application file for complete search history.

(56) References Cited

U.S. PATENT DOCUMENTS

| 4,151,021 A | 4/1979 | McElroy |
| 6,446,177 B1 | 9/2002 | Tanaka et al. |
| 8,417,902 B2 | 4/2013 | Kaabouch et al. |
| 2003/0071315 A1* | 4/2003 | Peng ....................... H01L 29/94 257/390 |
| 2007/0252201 A1 | 11/2007 | Kito et al. |
| 2010/0220517 A1 | 9/2010 | Okayama |

* cited by examiner

*Primary Examiner* — Huan Hoang
(74) *Attorney, Agent, or Firm* — Foley & Lardner LLP

(57) ABSTRACT

According to one embodiment, a semiconductor storage device includes: a memory cell array including a memory cell transistor that is an electrically rewritable non-volatile semiconductor storage element. The memory cell transistor includes a gate electrode and a channel region adjacent the gate electrode. The semiconductor storage device includes a circuit configured to write the memory cell transistor by applying a breakdown voltage to cause dielectric breakdown between the gate electrode and the channel region.

10 Claims, 15 Drawing Sheets

| ITEM | NAND TYPE FLASH MEMORY | SEMI-CONDUCTOR STORAGE DEVICE 1 |
|---|---|---|
| WL0: WORD LINE TO BE WRITTEN | 20V | 40V |
| WL1 TO WLn: WORD LINE NOT TO BE | 10V | Z |
| BL0: BIT LINE TO BE WRITTEN | 0V | 0V |
| BL1,2, …: BIT LINE NOT TO BE | 3V | 3V |
| SGD: DRAIN-SIDE SELECT GATE LINE | 3V | 3V |
| SGS: SOURCE-SIDE SELECT GATE LINE | 0V | 0V |
| SL: SOURCE LINE | 0V | 0V |

| ITEM | NAND TYPE FLASH MEMORY | SEMI-CONDUCTOR STORAGE DEVICE 1 |
|---|---|---|
| WL0: WORD LINE TO BE READ | 0V | 0V |
| WL1 TO WLn: WORD LINE NOT TO BE | 4.5V | Z |
| BL0: BIT LINE TO BE READ | 0.7V→Z | 0.7V→Z |
| BL1,2, ...: BIT LINE NOT TO BE | 0V→Z | 0V→Z |
| SGD: DRAIN-SIDE SELECT GATE LINE | 3V | 3V |
| SGS: SOURCE-SIDE SELECT GATE LINE | 0V | 0V |
| SL: SOURCE LINE | 0V | 0V |

| ITEM | NAND TYPE FLASH MEMORY | SEMI-CONDUCTOR STORAGE DEVICE 1 |
|---|---|---|
| WL0: WORD LINE TO BE WRITTEN | 20V | 20V |
| WL1 TO WLn: WORD LINE NOT TO BE WRITTEN | 10V | Z |
| BL0: BIT LINE TO BE WRITTEN | 0V | 0V |
| BL1,2, ...: BIT LINE NOT TO BE WRITTEN | 3V | 3V |
| SGD: DRAIN-SIDE SELECT GATE LINE | 3V | 3V |
| SGS: SOURCE-SIDE SELECT GATE LINE | 0V | 0V |
| SL: SOURCE LINE | 0V | 0V |

# SEMICONDUCTOR STORAGE DEVICE

CROSS-REFERENCE TO RELATED APPLICATION(S)

This application is based upon and claims the benefit of priority from Japanese Patent Application No. 2019-166825, filed Sep. 13, 2019, the entire contents of which are incorporated herein by reference.

FIELD

Embodiments described herein relate generally to a semiconductor storage device.

BACKGROUND

As a read only memory (ROM), a mask ROM, a writable erasable programmable ROM (EPROM), and an eFuse programmable by a fuse are used. However, in the-above described ROMs, it is difficult to obtain desired performance in terms of data retention property and memory density.

On the other hand, a NAND type flash memory using an electrically rewritable non-volatile semiconductor storage element is low in manufacturing cost, and can increase the memory density thereof by arranging a storage element three-dimensionally (refer to U.S. Pat. No. 5,016,832). However, the NAND type flash memory uses a floating gate type or charge trap type storage element. Therefore, there is a problem that the time for keeping stored data decreases due to a time change of a charge stored in the storage element (hereinafter referred to as a "data retention problem").

The NAND type flash memory is originally rewritable. Therefore, even though a user wishes to use the NAND type flash memory as application of a one time programmable read only memory (OTPROM), it is possible to change the stored data by erasing the stored data and rewriting new data, and thus writing cannot be limited to one time.

Examples of related art include U.S. Pat. No. 5,016,832.

DESCRIPTION OF THE DRAWINGS

FIG. 7A illustrates a case where a drain voltage is constant and FIG. 7B illustrates a case where a gate voltage is constant;

FIG. 8A illustrates a general equivalent circuit model, FIG. 8B illustrates an equivalent circuit model in an initial state, FIG. 8C illustrates an equivalent circuit model obtained by simplifying FIG. 8B, FIG. 8D illustrates an equivalent circuit model in a dielectric breakdown state, and FIG. 8E is an equivalent circuit model obtained by simplifying FIG. 8D;

DETAILED DESCRIPTION

Embodiments provide a semiconductor storage device not only capable of achieving high data retention property and high density, but also capable of preventing rewriting.

In general, according to one embodiment, a semiconductor storage device includes: a memory cell array including a memory cell transistor that is an electrically rewritable non-volatile semiconductor storage element. The memory cell transistor includes a gate electrode and a channel region adjacent the gate electrode. The semiconductor storage device includes a circuit configured to write the memory cell transistor by applying a breakdown voltage to cause dielectric breakdown between the gate electrode and the channel region.

Hereinafter, embodiments will be described with reference to the accompanying drawings. In the description of the drawings, the same component will be denoted by the same reference sign, and description thereof will be omitted.

First Embodiment

Figure 1:
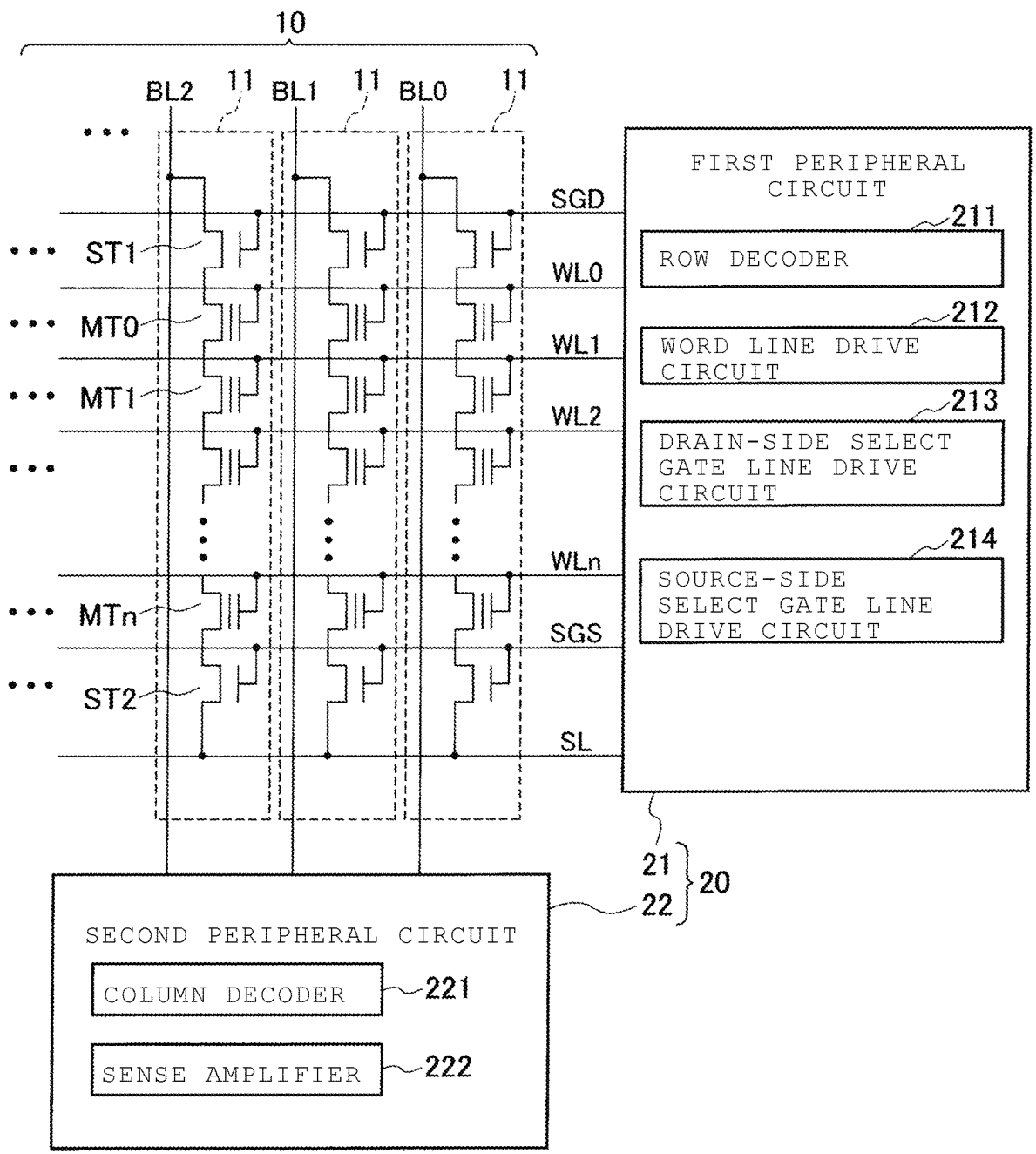
FIG. 1 is a schematic diagram illustrating a configuration of a semiconductor storage device according to a first embodiment.

As illustrated in FIG. 1, a semiconductor storage device 1 according to a first embodiment includes a memory cell array 10 and a peripheral circuit 20 that controls the memory cell array 10. Memory cell transistors MT0 to MTn of the memory cell array 10 are electrically rewritable non-volatile semiconductor storage elements (n: natural number). Hereinafter, any one or all the memory cell transistors MT0 to MTn are also collectively referred to as a "memory cell transistor MT". The memory cell transistor MT is, for example, a non-volatile semiconductor storage element having a configuration in which a threshold voltage is changed by a charge stored between a gate electrode and a channel region, similar to a memory cell transistor used for a NAND type flash memory.

In the semiconductor storage device 1, the peripheral circuit 20 performs a write operation of electrically connecting the gate electrode and the channel region by performing dielectric breakdown between the gate electrode of the memory cell transistor to be written selected from the memory cell array 10 and the channel region thereof. In the write operation, the peripheral circuit 20 applies a breakdown voltage causing the dielectric breakdown between the gate electrode and the channel region to the gate electrode of the memory cell transistor to be written.

First, a configuration of the semiconductor storage device 1 will be described before the detail of the write operation of the semiconductor storage device 1 is described.

The semiconductor storage device 1 includes the memory cell array 10 including a plurality of bit lines BL0, BL1, . . . , and a plurality of word lines WL0 to WLn (n: an integer of 2 or more). The number of word lines is, for example, (n=95). Each of the memory cell transistors MT is associated with either one of the bit lines BL0, BL1, . . . and either one of the word lines WL0 to WLn. The number of bit lines and word lines may be chosen according to the specification of the semiconductor storage device 1. Hereinafter, any one or all the bit lines BL0, BL1, . . . are also collectively referred to as a bit line BL. Any one or all the word lines WL0 to WLn are also collectively referred to as a word line WL.

The memory cell array 10 has a configuration in which a plurality of memory strings 11 are arranged in parallel. Each of the memory strings 11 has a configuration in which a plurality of memory cell transistors MT and select transistors for selecting the memory strings 11 are connected in series. As illustrated in FIG. 1, the memory strings 11 includes a drain-side select transistor ST1 connected to the bit line BL and a source-side select transistor ST2 connected to a source line SL as a select transistor. The memory strings 11 has a configuration in which the memory cell transistors MT0 to MTn are connected in series between the drain-side select transistor ST1 and the source-side select transistor ST2.

A drain-side select gate line SGD is connected to a gate electrode of the drain-side select transistor ST1. A source-side select gate line SGS is connected to a gate electrode of the source-side select transistor ST2. The word lines WL0 to WLn are connected to gate electrodes of the memory cell transistors MT0 to MTn.

The peripheral circuit 20 that controls the memory cell array 10 includes a first peripheral circuit 21 and a second peripheral circuit 22. The first peripheral circuit 21 includes a row decoder 211, a word line drive circuit 212, a drain-side select gate line drive circuit 213, and a source-side select gate line drive circuit 214. The second peripheral circuit 22 includes a column decoder 221 and a sense amplifier 222.

The peripheral circuit 20 sets the state of the memory cell transistor MT and the select transistor, and executes the write operation of the semiconductor storage device 1 and a read operation thereof. The row decoder 211 selects a word line to be operated, and the column decoder 221 selects a bit line to be operated. The word line drive circuit 212 sets the voltage of the word lines WL0 to WLn. The drain-side select gate line drive circuit 213 sets the voltage of the drain-side select gate line SGD, and the source-side select gate line drive circuit 214 sets the voltage of the source-side select gate line SGS. The sense amplifier 222 detects the voltage of the bit line.

Figure 2:
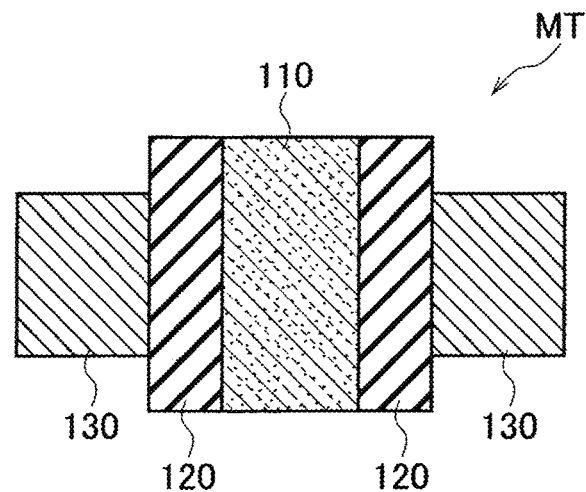
FIG. 2 is a schematic cross-sectional view illustrating a configuration of a memory cell transistor.

The memory cell transistor MT which is a non-volatile semiconductor storage element is, for example, a charge trap type storage element illustrated in FIG. 2. The memory cell transistor MT illustrated in FIG. 2 includes: a columnar semiconductor 110 including a channel region; a gate insulating film 120 disposed around a side surface of the columnar semiconductor 110 and including a charge storage layer; and an electrode layer 130 disposed around the gate insulating film 120, and FIG. 2 is a cross-sectional view parallel to a central axis of the columnar semiconductor 110. The gate insulating film 120 is, for example, a stacked film (Oxide/Nitride/Oxide film: ONO film) in which a silicon oxide film, a silicon nitride film, and a silicon oxide film are stacked in this order. When the ONO film is used for the gate insulating film 120, a SiN trap discretely distributed in the silicon nitride film stores the charge. One of the charge trap type storage elements is one of the memory cells of the memory cell array 10.

Figure 3:
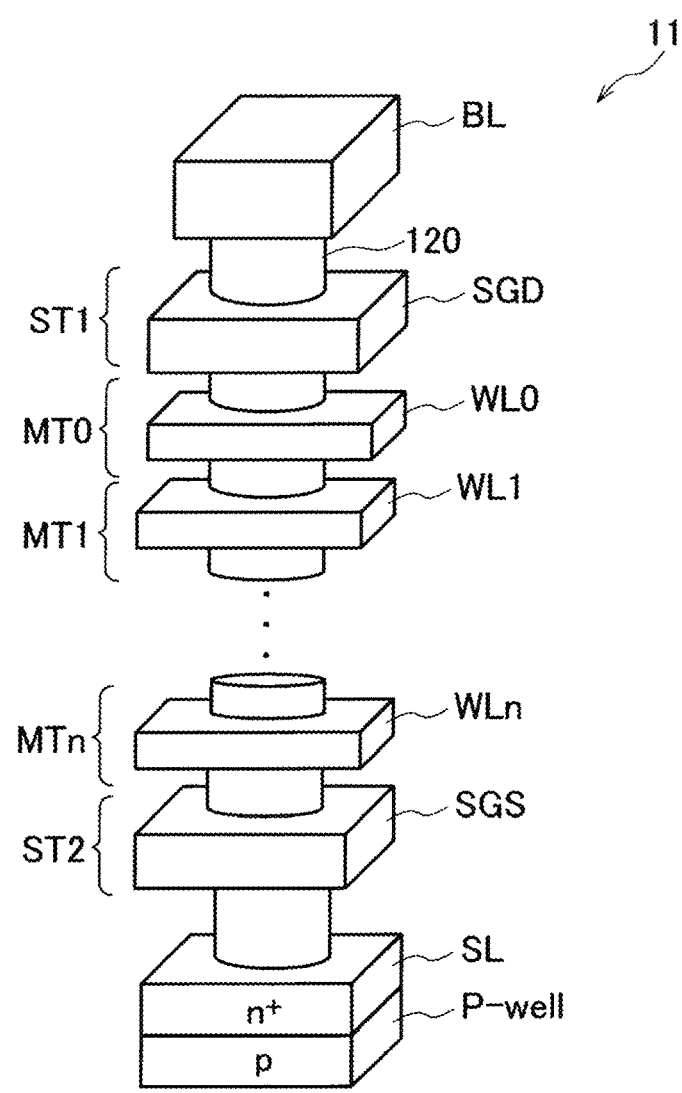
FIG. 3 is a schematic perspective view illustrating a configuration of memory strings.

FIG. 3 illustrates an example in which the memory strings 11 is configured with the memory cell transistor MT illustrated in FIG. 2. In the memory strings 11 illustrated in FIG. 3, the columnar semiconductor 110 is common to the drain-side select transistors ST1, the memory cell transistors MT0 to MTn, and the source-side select transistor ST2. That is, the plurality of electrode layers 130 are apart from each other along a central axis direction of the columnar semiconductor 110, and each of the electrode layers 130 is either one of word lines WL0 to WLn, the drain-side select gate line SGD, or the source-side select gate line SGS. A region adjacent to the gate insulating film 120 of the electrode layer 130 corresponding to the word lines WL0 to WLn is the gate electrode of each of the memory cell transistors MT0 to MTn. That is, the electrode layer 130 corresponds to the gate electrode of the memory cell transistor MT. A gate insulating film not including the charge storage layer is formed between the drain-side select gate line SGD, the source-side select gate line SGS, and the columnar semiconductor 110.

A lower end of the columnar semiconductor 110 of the memory strings 11 is connected to an n+ region formed in a p-type well region P-well of a semiconductor substrate. The n+ region is the source line SL. An upper end of the columnar semiconductor 110 is connected to the bit line BL.

Figure 4:
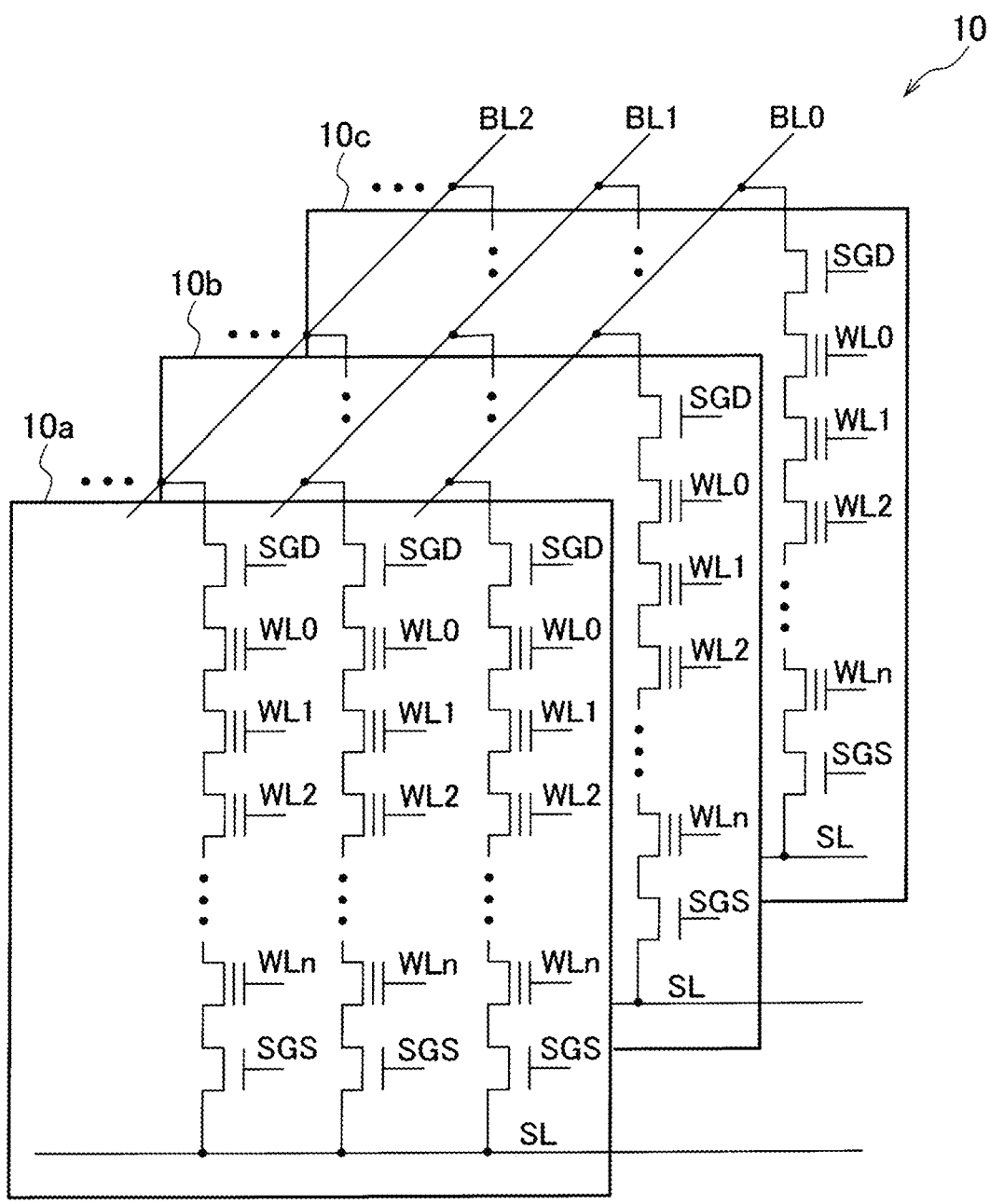
FIG. 4 is a schematic circuit diagram of a memory cell array in which the memory cell transistor is three-dimensionally arranged.
Figure 5:
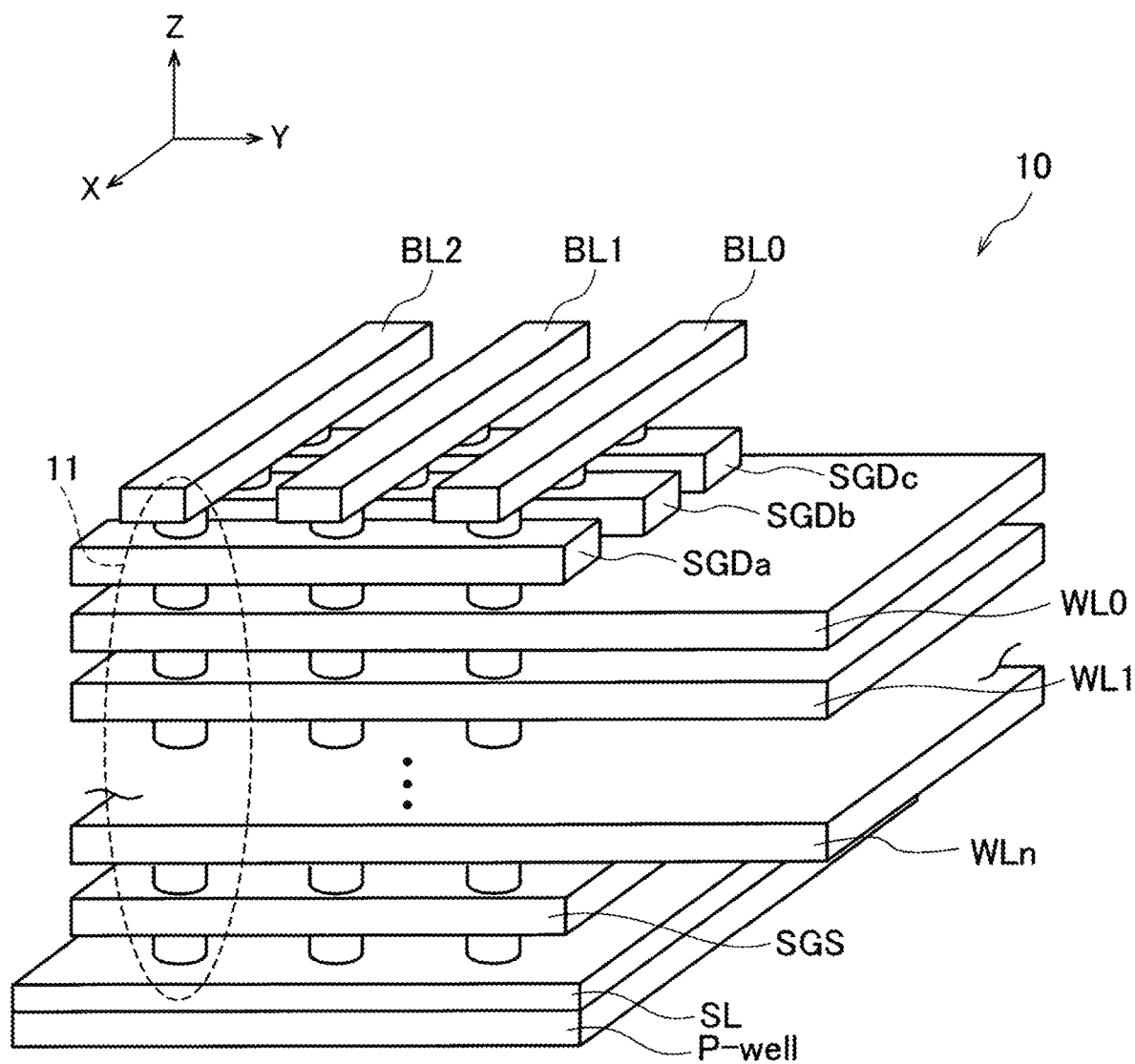
FIG. 5 is a schematic perspective view of the memory strings arranged in a matrix shape.

FIG. 4 illustrates an example in which the memory cell transistor MT is three-dimensionally arranged. The memory cell array 10 illustrated in FIG. 4 has a configuration in which a first memory cell array 10a, a second memory cell array 10b, and a third memory cell array 10c, respectively having the same configuration as that of the memory cell array 10 illustrated in FIG. 1, are disposed in parallel. That is, the memory cell array 10 illustrated in FIG. 4 has a configuration in which the memory strings 11 are disposed in a matrix shape as illustrated in FIG. 5. In FIG. 5, a Z-axis direction is an extending direction of the memory strings 11, an X-direction is an extending direction of the bit line BL, and the word line WL is disposed in a plate shape in parallel to an XY plane perpendicular to the Z-axis direction. The memory cell array 10 includes a case where the memory cell array 10 is configured with the memory cell transistor MT three-dimensionally arranged as illustrated in FIGS. 4 and 5. A configuration of the memory cell array 10 of the semiconductor storage device 1 is the same as that of a general NAND type flash memory.

In the memory cell array 10 illustrated in FIG. 5, the word lines WL0 to WLn, the source-side select gate line SGS, and the source line SL are common to the memory strings 11 forming the memory cell array 10, and have a plate-shaped planar structure. That is, each of the word lines WL0 to WLn connected to the gate electrode of the memory cell transistor MT of each of the memory strings 11 is the same conductive layer. For example, for each integer i (i=0 to n), all the gate electrodes of the memory cell transistors MTi of each of the memory string 11 are connected to the corresponding word line WLi.

On the other hand, the drain-side select gate line SGD is independent between the first memory cell array 10a, the second memory cell array 10b, and the third memory cell array 10c illustrated in FIG. 4. That is, a first drain-side select gate line SGDa is connected to the gate electrode of the drain-side select transistor ST1 of the first memory cell array 10a. A second drain-side select gate line SGDb is connected to the gate electrode of the drain-side select transistor ST1 of the second memory cell array 10b. A third drain-side select gate line SGDc is connected to the gate electrode of the drain-side select transistor ST1 of the third memory cell array 10c.

Figure 6:
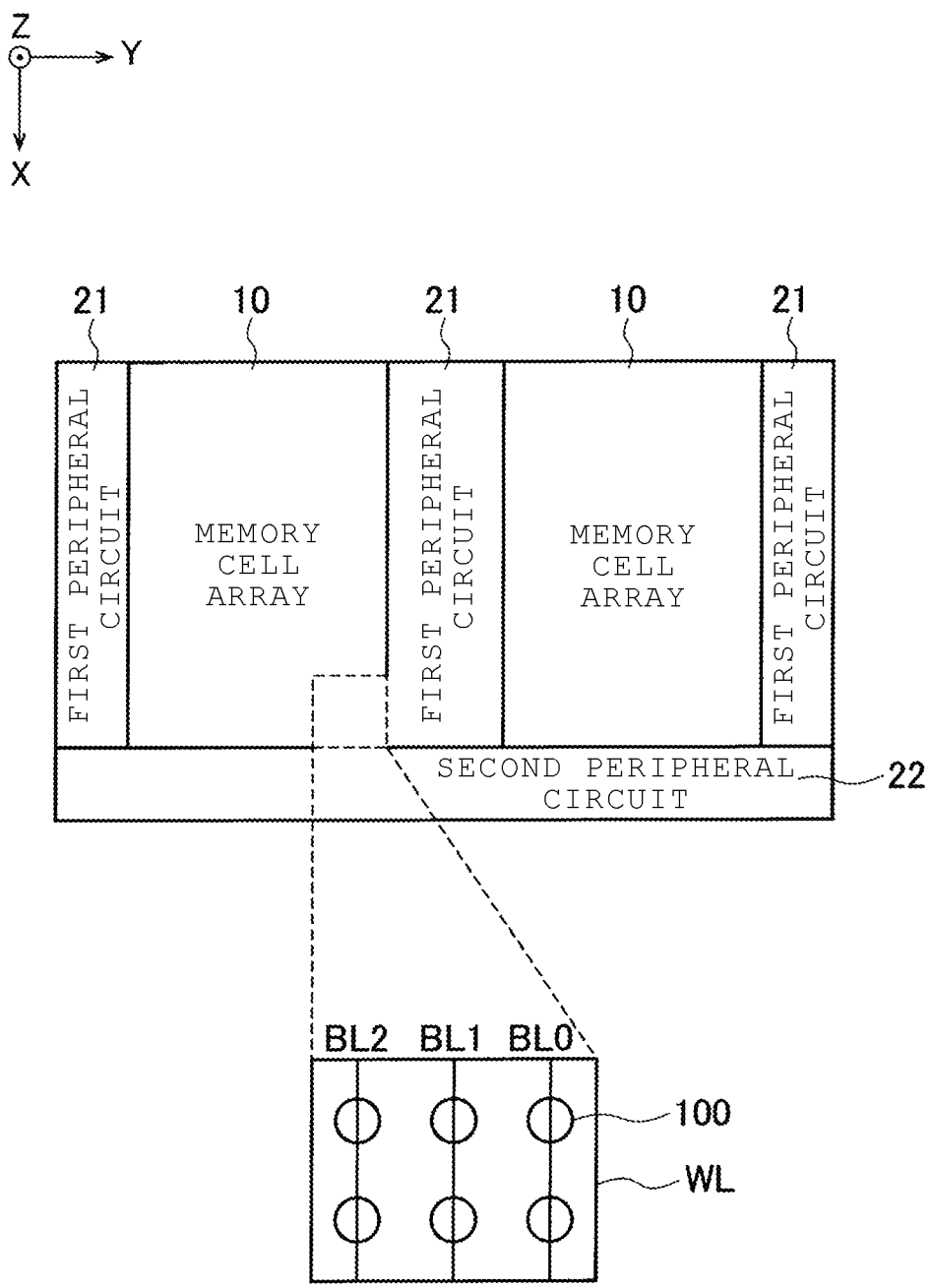
FIG. 6 is a schematic plan view of the semiconductor storage device and the memory strings arranged in the matrix shape.

The bit lines BL0, BL1, . . . are common to the first memory cell array 10a, the second memory cell array 10b, and the third memory cell array 10c. FIG. 6 illustrates the word line WL in a plan view perpendicular to the extending direction (Z-axis direction) of the semiconductor storage device 1 and the memory strings 11. As illustrated in FIG. 6, the plurality of memory cell arrays 10 are provided on the semiconductor substrate. In the example illustrated in FIG. 6, two memory cell arrays 10 are provided side by side in the Y direction on the semiconductor substrate. The first peripheral circuit 21 is provided between the two memory cell arrays 10 along the Y direction. The second peripheral circuit 22 is provided in a region extending in the X direction of the memory cell array 10. A circular region 100 in the plan view illustrated in FIG. 6 is a columnar region forming the memory strings 11. As illustrated in FIG. 6, the word line WL is disposed in a plate shape in parallel to the XY plane, and the word line WLi connected to the gate electrode of the memory cell transistor MTi is common in the memory strings 11 forming the memory cell array 10.

Figure 7A:
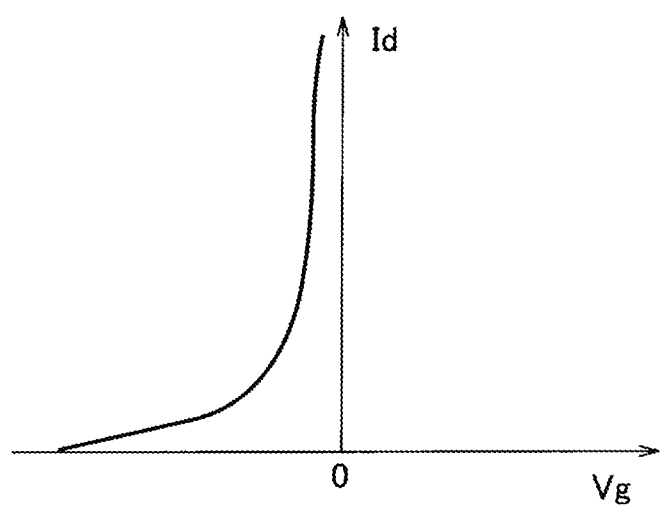
FIGS. 7A and 7B are graphs illustrating voltage-current characteristics of the memory cell transistor in an initial state of the semiconductor storage device.
Figure 7B:
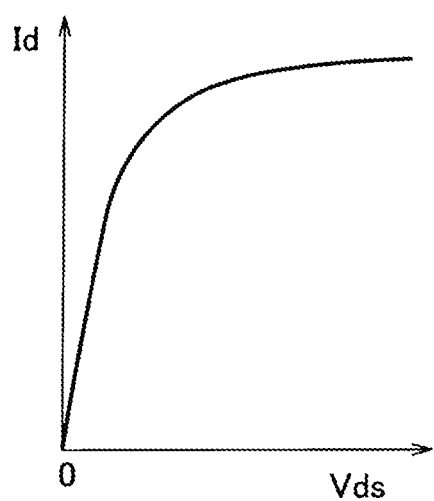

Next, characteristics of the memory cell transistor MT will be described. In a state immediately after the semiconductor storage device 1 is manufactured (hereinafter referred to as an "initial state"), the state of all the memory cell transistors MT corresponds to an erased state of the NAND type flash memory. That is, the threshold voltage of the memory cell transistor MT is 0 V or less. FIGS. 7A and 7B illustrate voltage-current characteristics of the memory cell transistor MT in the initial state. FIG. 7A illustrates a case where a constant drain voltage Vds between a drain region and a source region is constant (for example, 0.1 V); and FIG. 7B illustrates a case where a gate voltage Vg is constant (for example, 0 V). Even though the gate voltage Vg is 0 V, when the drain voltage Vds is applied to the memory cell transistor MT, a drain current Id flows and the memory cell transistor MT becomes a conductive state.

Figure 8A:
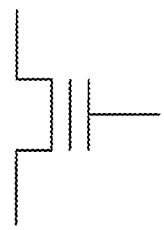
FIGS. 8A to 8E illustrate an equivalent circuit model of the memory cell transistor.
Figure 8B:
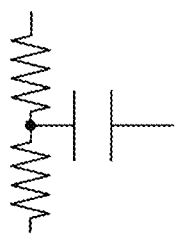

Therefore, the memory cell transistor MT in the conductive state is regarded as equivalent to a resistance element. Parasitic capacitance exists between the channel region between the drain region and the source region, and the gate electrode. Therefore, in general, an equivalent circuit model of the memory cell transistor MT represented in FIG. 8A can be represented in FIG. 8B in the initial state.

Figure 8C:
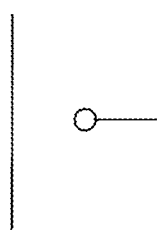

Here, the equivalent resistance element of the memory cell transistor MT and the parasitic capacitance are considered to be negligibly small compared to the resistance and capacitance generated in other components of the memory cell array 10 such as metal wiring and polysilicon wiring. Then, the equivalent circuit model of the memory cell transistor MT can be simplified as illustrated in FIG. 8C. In the equivalent circuit model in FIG. 8C, a space between the drain region and the source region are short-circuited, and a space between the gate electrode and the channel region is electrically insulated.

When the configuration illustrated in FIG. 2 is used for the memory cell transistor of the NAND type flash memory, a voltage is applied between the channel region of the columnar semiconductor 110 and the electrode layer 130 corresponding to the gate electrode, and then electrons are captured in the charge storage layer of the gate insulating film 120. Accordingly, the write operation of the NAND type flash memory is performed.

Figure 8D:
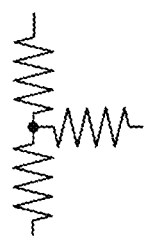
Figure 8E:
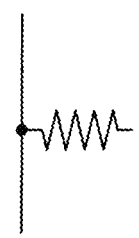

On the other hand, in the write operation of the semiconductor storage device 1, the dielectric breakdown is performed between the gate electrode of the memory cell transistor MT to be written and the channel region thereof, after which the gate electrode of the memory cell transistor MT to be written and the channel region thereof are electrically connected to each other. Here, a higher voltage is applied to the gate electrode of the memory cell transistor MT to be written than that of the write operation of the NAND type flash memory, causing irreversible dielectric breakdown in the gate insulating film 120. A state where the gate insulating film 120 is under the dielectric breakdown is also hereinafter referred to as a "dielectric breakdown state". The equivalent circuit model of the memory cell transistor MT in the dielectric breakdown state can be represented by FIG. 8D. The equivalent circuit model of the memory cell transistor MT can be represented by FIG. 8E by simplifying the equivalent circuit model in FIG. 8D.

Figure 9:
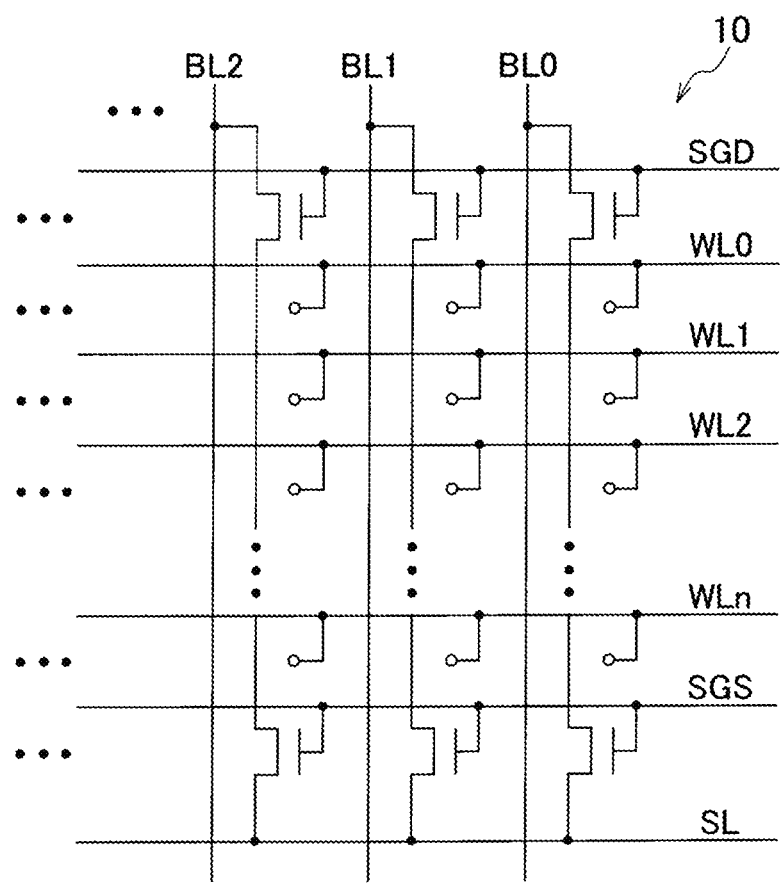
FIG. 9 is a schematic circuit diagram of the memory cell array in an initial state of the semiconductor storage device.
Figure 10:
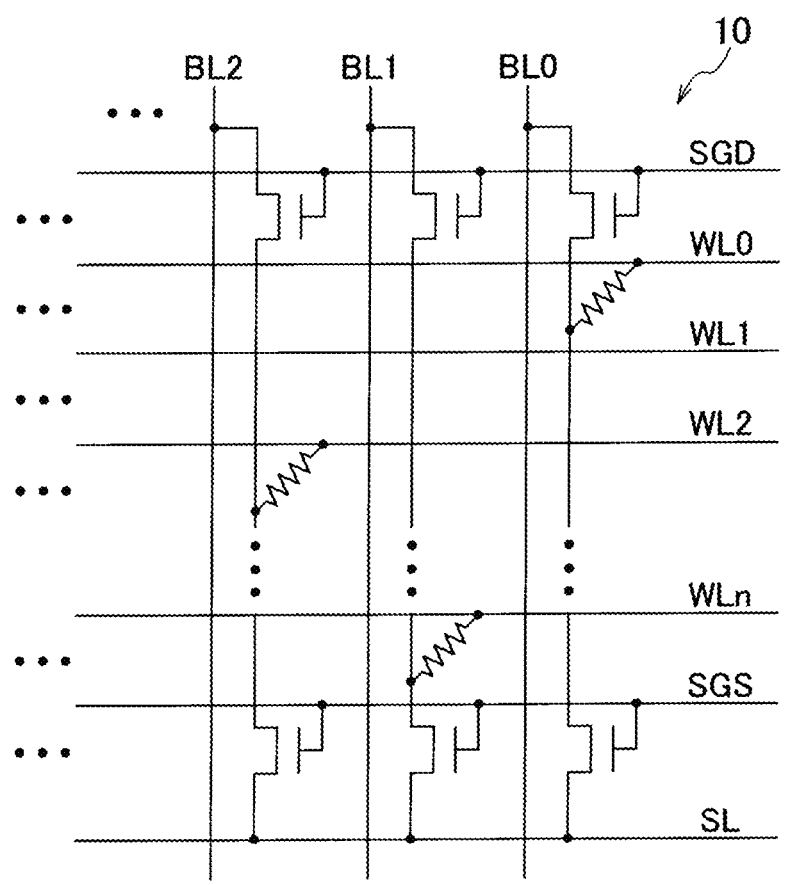
FIG. 10 is a schematic circuit diagram of the memory cell array after executing a write operation of the semiconductor storage device.

FIG. 9 illustrates an equivalent circuit of the memory cell array 10 of the semiconductor storage device 1 in the initial state. In FIG. 9, all the memory cell transistors MT are represented by the equivalent circuit model of FIG. 8D. On the other hand, FIG. 10 illustrates the equivalent circuit of the memory cell array 10 after the write operation is executed. In FIG. 10, the written memory cell transistor MT is illustrated by the equivalent circuit model of FIG. 8E. That is, the memory cell transistors MT respectively associated with the bit line BL0 and the word line WL0, the bit line BL1 and the word line WLn, and the bit line BL2 and the word line WL2 are the written memory cell transistors MT.

Figures 11, 12:
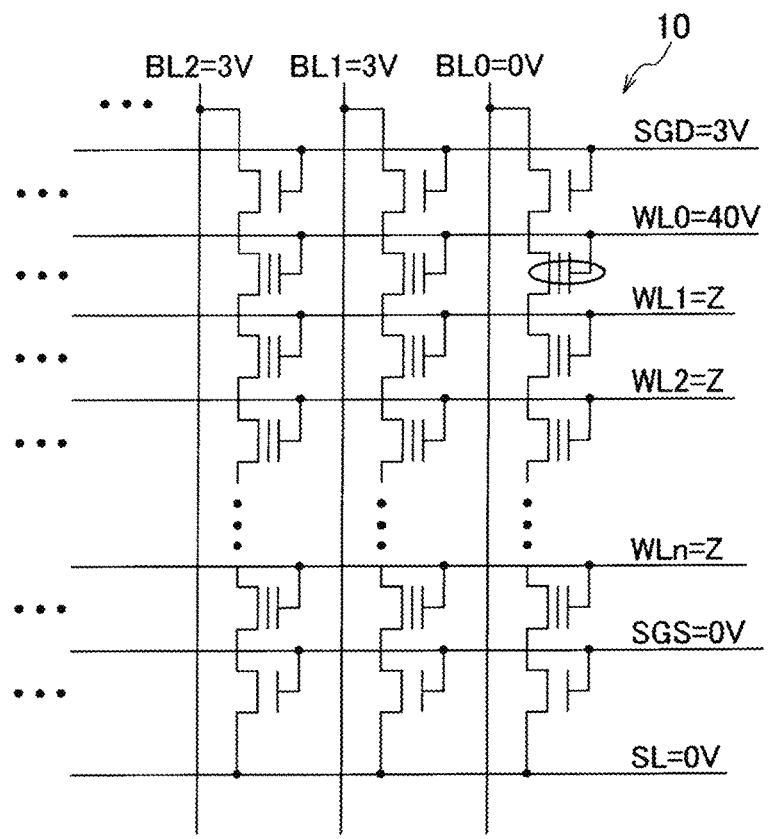
FIG. 11 is a table showing voltage settings in the write operation of a NAND type flash memory and the semiconductor storage device.
FIG. 12 is a schematic circuit diagram of the memory cell array in the write operation of the semiconductor storage device.

FIG. 11 illustrates a table in which voltage settings in the write operation of the general NAND type flash memory and voltage settings in the write operation of the semiconductor storage device 1 are compared with each other. Hereinafter, a case where the memory cell transistor to be written is the memory cell transistor associated with the bit line BL0 and the word line WL0 will be described as an example. The bit line BL0 is referred to as a "bit line to be written", and a bit line other than the bit line BL0 is referred to as a "bit line not to be written". The word line WL0 is referred to as a "word line to be written", and a word line other than the word line WL0 is referred to as a "word line not to be written". The symbol "Z" indicates a floating state (the same applies hereinafter).

The NAND type flash memory performs the write operation as follows. As illustrated in FIG. 11, the peripheral circuit of the NAND type flash memory respectively applies 3 V to the drain-side select gate line SGD, 0 V to the source-side select gate line SGS, and 0 V to the source line SL over a fixed program time tPROG (for example, 500 μsec). The well region P-well is set to 0 V. Then, the peripheral circuit applies 0 V to the bit line to be written and 3 V to the bit line not to be written. The peripheral circuit applies 20 V to the word line to be written and 10 V to the word line not to be written. As a result, electric field strength applied to a charge storage layer of the memory cell transistor to be written increases, electrons are injected into the charge storage layer thereof, and the threshold voltage is shifted in a positive direction. That is, data of "0" are written to the memory cell transistor to be written.

On the other hand, even in the write operation of the semiconductor storage device 1, the peripheral circuit 20 applies the voltage settings shown in FIG. 11 to each wiring of the memory cell array 10 for the fixed program time tPROG (for example, 500 μsec). However, the applied voltage value is different from that of the write operation of the NAND type flash memory. That is, a voltage value of 40 V, which is higher than that of the write operation of the NAND type flash memory, is applied to the word line to be written. Accordingly, a voltage difference of 40 V is applied across the gate insulating film 120 of the memory cell transistor MT to be written, and the dielectric breakdown is triggered in the gate insulating film 120.

In the semiconductor storage device 1, in order to perform the dielectric breakdown between the gate electrode and the channel region, the breakdown voltage applied to the gate electrode of the memory cell transistor MT to be written is set to a voltage value higher than a withstand voltage between the gate electrode and the channel region. The peripheral circuit 20 applies the breakdown voltage to either one of the electrode layers 130 corresponding to the word lines WL0 to WLn of the memory strings 11 as the gate electrode of the memory cell transistor MT to be written.

In the write operation of the general NAND type flash memory, a voltage at which the memory cell transistor is turned on regardless of the its threshold voltage is applied to the word line not to be written. FIG. 11 illustrates an example in which 10 V is applied to the word line not to be written.

On the other hand, in the semiconductor storage device 1 after the write operation is performed, the memory cell transistor MT is either in the initial state where the threshold voltage is 0 V or lower, or in the dielectric breakdown state. Even in either of the initial state and the dielectric breakdown state, the drain region of the memory cell transistor MT and the source region thereof are in the conductive state. Therefore, the peripheral circuit 20 puts the word line not to be written into the floating state. Even though some of the memory cell transistor MT connected to the word line not to be written are in the dielectric breakdown state, by floating the word line not to be written, a new write operation is not affected.

FIG. 12 illustrates an example of the voltage settings of each wiring of the memory cell array 10 of the semiconductor storage device 1 in the write operation. The memory cell transistor to be written is a memory cell transistor associated with the bit line BL0 and the word line WL0 and indicated by an oval mark in FIG. 12.

Figures 13, 14:
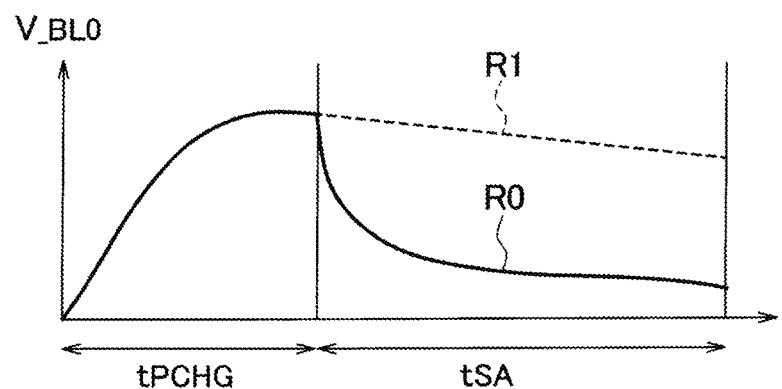
FIG. 13 is a table showing a set voltage in a read operation of the NAND type flash memory and the semiconductor storage device.
FIG. 14 is a schematic diagram illustrating the read operation of the semiconductor storage device.

Next, the read operation of the general NAND type flash memory and the semiconductor storage device 1 will be described. FIG. 13 illustrates a table in which voltage settings in the read operation of the NAND type flash memory and voltage settings in the read operation of the semiconductor storage device 1 are compared with each other. Hereinafter, a case where the memory cell transistor to be read is a memory cell transistor associated with the bit line BL0 and the word line WL0 will be described as an example. The bit line BL0 is referred to as a "bit line to be read", and a bit line other than the bit line BL0 is referred to as a "bit line not to be read". The word line WL0 is referred to as a "word line to be read", and a word line other than the word line WL0 is referred to as a "word line not to be read".

As illustrated in FIG. 13, in the read operation of the NAND type flash memory, the peripheral circuit of the NAND type flash memory respectively applies 3 V to the drain-side select gate line SGD, 0 V to the source-side select gate line SGS, and 0 V to the source line SL. The well region P-well is set to 0 V. The peripheral circuit applies 0 V to the word line to be read and 4.5 V to the word line not to be read. Then, the peripheral circuit precharges the bit line to be read to a predetermined voltage (for example, 0.7 V), and puts the precharged bit line in a floating state after the predetermined time is elapsed. Accordingly, whether a current flows through the bit line to be read is determined depending on whether the threshold voltage of the memory cell transistor to be read is larger or smaller than 0 V. Therefore, the peripheral circuit senses the current of the bit line to be read, whereby the data stored in the memory cell transistor to be read can be read.

The read operation of the semiconductor storage device 1 is also the same as that of the general NAND type flash memory, and after precharging the bit line to be read to the predetermined voltage, the stored data are determined based upon whether a current flows by extracting the precharged charge from the bit line to be read. The read operation of the semiconductor storage device 1 will be described with reference to FIG. 14. A vertical axis in FIG. 14 represents a voltage V BL0 of the bit line to be read BL0, and a horizontal axis represents time.

Figure 15:
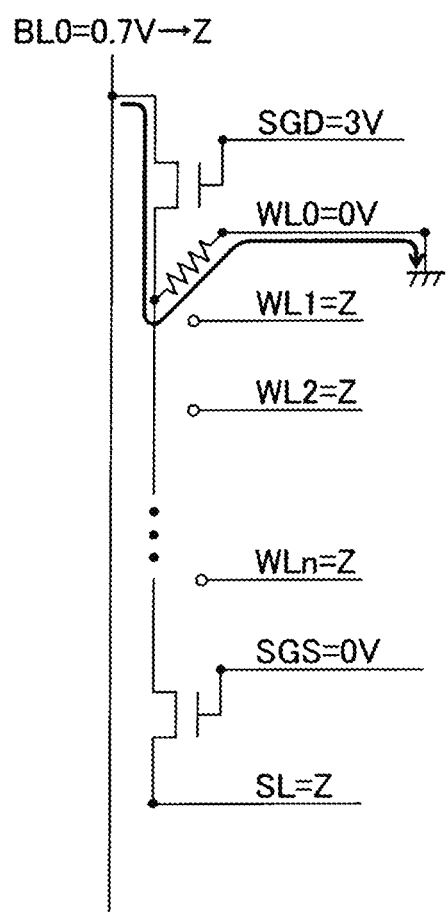
FIG. 15 is a schematic diagram illustrating an extraction path of a precharged charge in the semiconductor storage device.

As illustrated in FIG. 14, the peripheral circuit 20 precharges the bit line to be read BL0 for a fixed duration of time. A precharge voltage is, for example, 0.7 V, and a precharge time tPCHG is, for example, 10 μsec. After the precharge time tPCHG is elapsed, the peripheral circuit 20 stops precharging the bit line to be read BL0 and sets the drain-side select gate line SGD to 3 V, thereby trying to extract the charge from the bit line to be read BL0. Here, when the memory cell transistor to be read is in the dielectric breakdown state, as indicated by an arrow in FIG. 15, the charge is extracted from the bit line to be read BL0 to the word line to be read WL0. FIG. 15 illustrates a path of the charge extracted from the bit line to be read BL0 to the word line to be read WL0. As described above, when the write operation is performed in the memory cell transistor to be read, the charge is extracted from the bit line BL0 to be read.

For example, after the elapsed time tSA set to 20 μsec from the stop of the precharge, the peripheral circuit 20 operates the sense amplifier 222, thereby detecting the voltage of the bit line to be read BL0. The data stored in the memory cell transistor to be read can be detected by the detected voltage of the bit line to be read BL0.

That is, as indicated by a solid line R0 in FIG. 14, when the voltage of the bit line to be read BL0 is lower than a predetermined value, the memory cell transistor to be read is in the dielectric breakdown state. That is, the write operation is performed in the memory cell transistor to be read. On the other hand, as indicated by a broken line R1 in FIG. 14, when the voltage of the bit line to be read BL0 is higher than the predetermined value, the memory cell transistor to be read is in the initial state. That is, the write operation is not performed in the memory cell transistor to be read.

As described above, with respect to a point of determining the stored data depending on whether the charge precharged to the bit line to be read is extracted, the read operation of the semiconductor storage device 1 is the same as the read operation of the typical NAND type flash memory. However, the typical NAND type flash memory and the semiconductor storage device 1 have different paths for extracting the charge precharged to the bit line to be read. The NAND type flash memory controls the source-side select gate line SGS to turn on the source-side select transistor ST2, and extracts the charge via the source line SL. On the other hand, the semiconductor storage device 1 extracts the charge precharged to the bit line to be read via the gate insulating film 120 in the dielectric breakdown state and the word line to be read. Due to a difference in the paths, the semiconductor storage device 1 is different from the NAND type flash memory in that the word line not to be read is put in a floating state. Accordingly, the charge is prevented from being extracted via the word line not to be read.

That is, in the memory strings 11 in which a first memory cell transistor MT and a second memory cell transistor MT are connected in series, when reading data of the second memory cell transistor MT, a first word line WL connected to the first memory cell transistor MT is put in the floating state. Then, a predetermined voltage is applied to a second word line WL connected to the second memory cell transistor MT, and the predetermined voltage is applied to the bit line BL connected to the memory strings 11.

In the semiconductor storage device 1, the number of memory cell transistors MT in a breakdown voltage state by applying a breakdown voltage by the write operation shall be no more than one for a single memory string 11 because of the following reason.

Figures 16, 17:
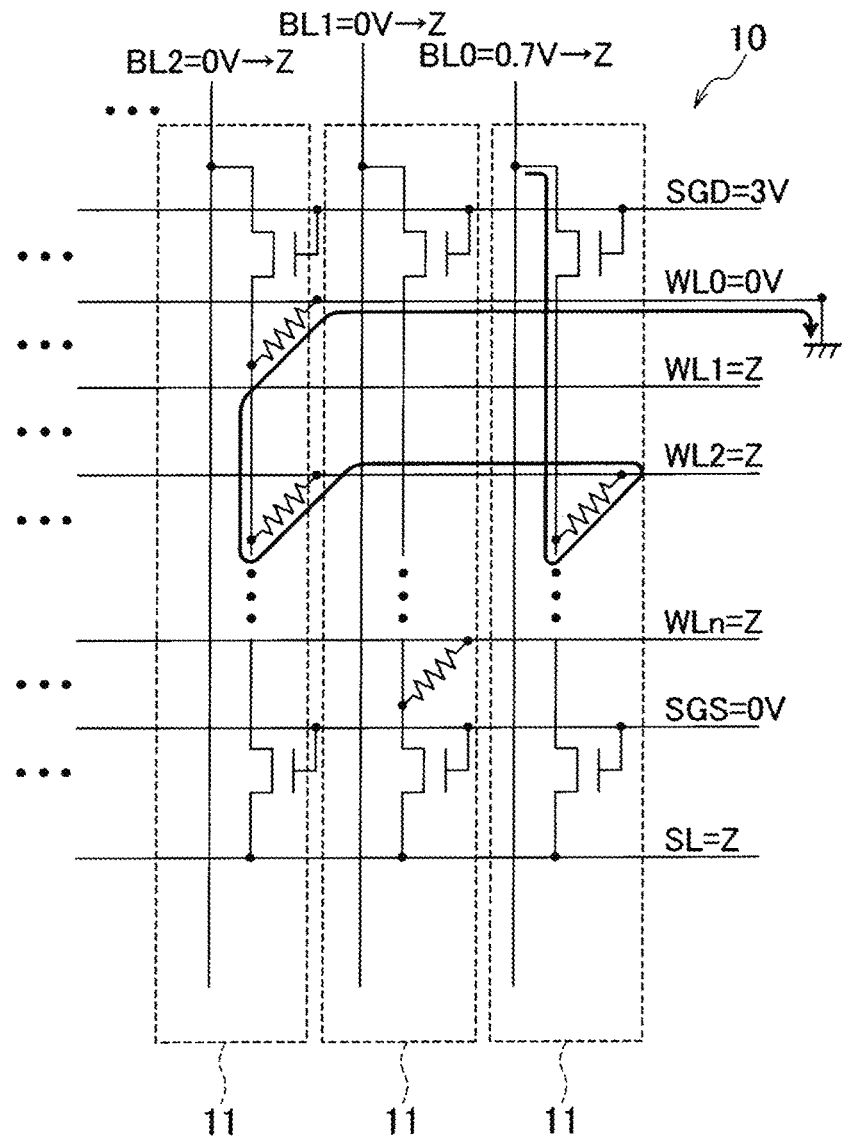
FIG. 16 is a schematic diagram illustrating write limitation in the semiconductor storage device embodiment.
FIG. 17 is a table showing voltage settings in a write operation of a NAND type flash memory and a semiconductor storage device according to a second embodiment.

For example, as illustrated in FIG. 16, with respect to the memory strings 11 connected to the bit line BL2, it is assumed that the memory cell transistors MT respectively connected to the word line WL0 and the word line WL2 are in the dielectric breakdown state. Here, when the read operation is performed for an unwritten memory cell transistor MT connected to the word line WL0 of the memory strings 11 connected to the bit line BL0, the charge precharged to the bit line to be read BL0 is extracted as shown by an arrow. That is, even though the memory cell transistor to be read MT is not written yet, the charge is extracted from the bit line to be read BL0 via the word line WL2, the bit line BL0, and the word line WL0.

As described above, when the write operation is performed to a plurality of memory cell transistors MT with respect to one memory string 11, in the read operation, there exists a sneak path of the charge as indicated by an arrow in FIG. 16. As a result, a normal read operation is disturbed. Therefore, the number of memory cell transistors MT to be written is required to be limited to no more than one for a single memory string 11.

Due to the above limitation of the writing, the storage capacity of the semiconductor storage device 1 is smaller than the storage capacity of the NAND type flash memory having the same number of memory cell transistors. Hereinafter, the storage capacity of the semiconductor storage device 1 will be described.

In the semiconductor storage device 1, one memory strings 11 includes n+1 memory cell transistors MT. For example, assume that the memory cell transistor MT is a memory cell transistor of a NAND type flash memory of a triple level cell (TLC) system capable of storing 3 bits of information per one memory cell transistor by setting 8 kinds of threshold voltages. Here, if n=95, the storage capacity per memory string of the NAND type flash memory is 96×3=288 bits. On the other hand, in the semiconductor storage device 1, only at most one memory cell transistor MT among the 96 memory cell transistors MT can be written. Therefore, the memory strings 11 of the semiconductor storage device 1 can acquire 97 kinds of states including a state in which no memory cell transistor MT is written. Here, the storage capacity per memory string 11 is $\log_2 97$=6.59 bits. That is, the storage capacity of the semiconductor storage device 1 is reduced to 6.59/288 (about 1/44) as compared with the NAND type flash memory.

To generalize this situation including memory cell transistors of other systems, the number of bits M1 of the storage capacity of the semiconductor storage device 1 is represented by the following formula (1) in which the number of bits of the storage capacity of the NAND type flash memory is defined as M0 and the number of word lines is set as L:

$$M1 = M0 \times \{\log_2(L+1)/(L \times b)\} \quad (1)$$

In formula (1), b is the number of bits that can be stored in one memory cell transistor. That is, in the case of a memory cell transistor MT used in a NAND type flash memory of a single-level cell (SLC) system capable of storing 1 bit data in one memory cell transistor, b=1. In a memory cell transistor of a NAND type flash memory of a multi-level cell (MLC) system, a TLC system, and a quad-level cell (QLC) system respectively capable of storing information of 2 bits, 3 bits, and 4 bits in one memory cell transistor, b=2, 3, and 4.

Hereinabove, the write operation and the read operation for each memory cell transistor MT are described. However, in the same manner as the typical NAND type flash memory, it is possible to control a plurality of bit lines so that the plurality of bit lines simultaneously become a target of the write operation and the read operation. As a result, a plurality of memory cell transistors MT connected to the same word line can be simultaneously set as a write target or a read target. That is, the write operation and read operation in page unit can be also performed.

With a block as a minimum unit, a block allocated to the semiconductor storage device 1 for implementing an OTPROM and a block allocated to the typical NAND type flash memory may be mixed in one memory chip.

As described above, in the semiconductor storage device 1 according to the first embodiment, the memory cell array 10 has the same configuration as that of the memory cell array of the NAND type flash memory. That is, the semiconductor storage device 1 may use the NAND type flash memory as an anti-fuse type OTPROM that performs the write operation by performing the dielectric breakdown of the gate insulating film 120.

On the other hand, in the mask ROM, since the stored data are determined by a mask pattern used in a manufacturing process, it is essential to determine the stored data before manufacturing a chip. Memory density of the mask ROM is lower than that of the NAND type flash memory. Since an EPROM uses a floating-gate type storage element, a data retention problem occurs. Also, memory density of the EPROM is lower than that of the NAND type flash memory. Memory density of an eFUSE memory is significantly lower than that of the NAND type flash memory. The density of the memory and the manufacturing cost thereof have a correlation. Therefore, according to the semiconductor storage device 1 using the NAND type flash memory as the OTPROM, the memory density can be increased and the manufacturing cost can be reduced.

According to the semiconductor storage device 1, since the data are stored by performing the dielectric breakdown of the gate insulating film 120, rewriting can be prevented. Therefore, even when it is required to prevent the rewriting of the stored data for security, the semiconductor storage device 1 is effective. Since the semiconductor storage device 1 is not a storage method in which the charge is stored in the gate insulating film 120, the data retention problem does not occur.

Therefore, according to the semiconductor storage device 1, it is possible to provide a large-capacity OTPROM that prevents the rewriting and does not cause the data retention problem at the same manufacturing cost as that of the NAND type flash memory.

Second Embodiment

In a semiconductor storage device 1 according to a second embodiment, the peripheral circuit 20 applies the breakdown voltage to the gate electrode of the memory cell transistor MT to be written until the time the gate insulating film 120 reaches the dielectric breakdown. A breakdown voltage may be lower than the withstand voltage between the gate electrode of the memory cell transistor MT to be written and the channel region thereof. That is, the applying duration of the breakdown voltage is set such that the dielectric breakdown occurs in the gate insulating film 120 by thermal energy generated by applying the breakdown voltage. In the description of the embodiment, description of the common configuration and operation as those of the first embodiment will be omitted.

A mechanism in which the dielectric breakdown occurs in the gate insulating film 120 is that an irreversible change occurs when energy consumption generated by a flow of the electron when a voltage is applied to the gate insulating film 120 changes to heat. Therefore, in the semiconductor storage device 1 according to the second embodiment, a generated amount of the thermal energy is increased by extending the time for applying the voltage to the gate electrode, thereby generating the dielectric breakdown in the gate insulating film 120.

FIG. 17 illustrates a table in which voltage settings in the write operation of the typical NAND type flash memory and voltage settings in the write operation of the semiconductor storage device 1 according to the second embodiment are compared with each other. FIG. 17 illustrates a case in which the memory cell transistor to be written is the memory cell transistor MT associated with the bit line BL0 and the word line WL0.

As illustrated in FIG. 17, a voltage supplied to the word line to be written is set to be the same as that of the write operation of the NAND type flash memory (for example, 20 V). Then, the peripheral circuit 20 supplies the voltage to the word line to be written for a program time tPROG (for example, 10 seconds). That is, the voltage is applied to the word line to be written for a longer time than the program time tPROG (for example, 500 μsec) of the write operation of the NAND type flash memory. Accordingly, the thermal energy generated in the gate insulating film 120 of the memory cell transistor to be written increases, and the dielectric breakdown occurs in the gate insulating film 120.

According to the semiconductor storage device 1 according to the second embodiment, in the same manner as the first embodiment, since the data are stored by performing the dielectric breakdown of the gate insulating film 120, it is possible to provide the OTPROM which can prevent the rewriting and does not cause the data retention problem. According to the semiconductor storage device 1 according to the second embodiment, even when the peripheral circuit 20 does not have a function of generating a voltage higher than the voltage set by the write operation of the NAND type flash memory in the word line, it is possible to cause the dielectric breakdown in the gate electrode.

Other Embodiments

Hereinabove, an example in which the charge trap type storage element is three-dimensionally arranged as the memory cell transistor MT is described. However, the memory cell transistor MT may have another structure. For example, a configuration in which the floating gate type storage element is two-dimensionally arranged as the memory cell transistor MT may be adopted.

Figure 18:
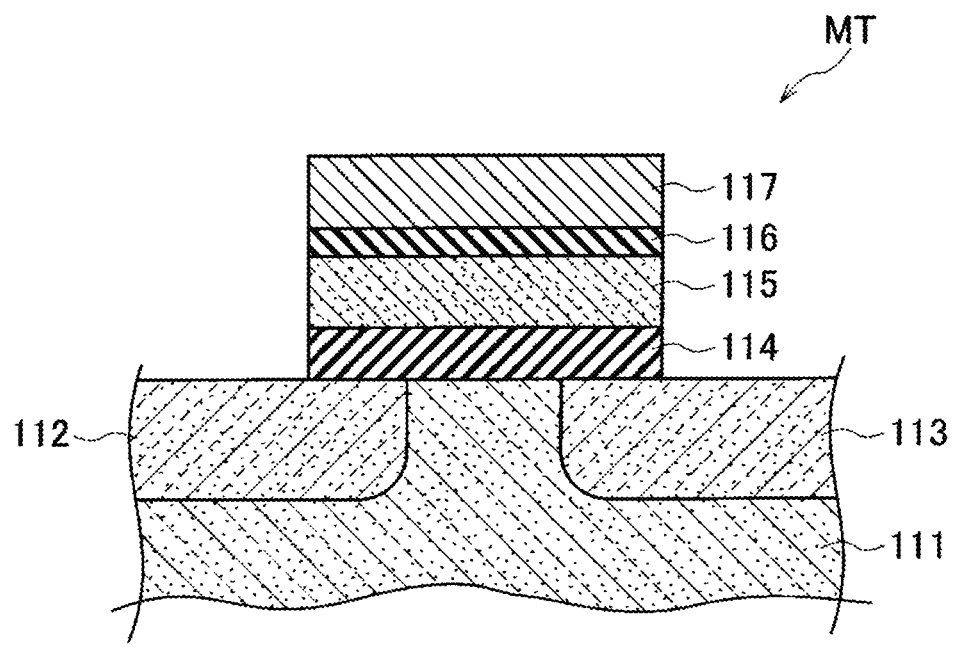
FIG. 18 is a schematic cross-sectional view illustrating another configuration of the memory cell transistor.

FIG. 18 illustrates an example of the floating gate type storage element. The storage element illustrated in FIG. 18 has a configuration in which a tunnel oxide film 114, a floating gate 115, a gate oxide film 116, and a control gate electrode 117 are stacked on an upper surface of a channel region between a source region 112 and a drain region 113 formed on a semiconductor substrate 111. When the storage element illustrated in FIG. 18 is used for the memory cell transistor MT of the semiconductor storage device 1, a breakdown voltage that causes dielectric breakdown between the channel region and the control gate electrode 117 is applied to the control gate electrode 117. That is, the tunnel oxide film 114, the floating gate 115, and the gate oxide film 116 are put in a dielectric breakdown state, whereby the channel region and the control gate electrode 117 are electrically connected to each other.

Figure 19:
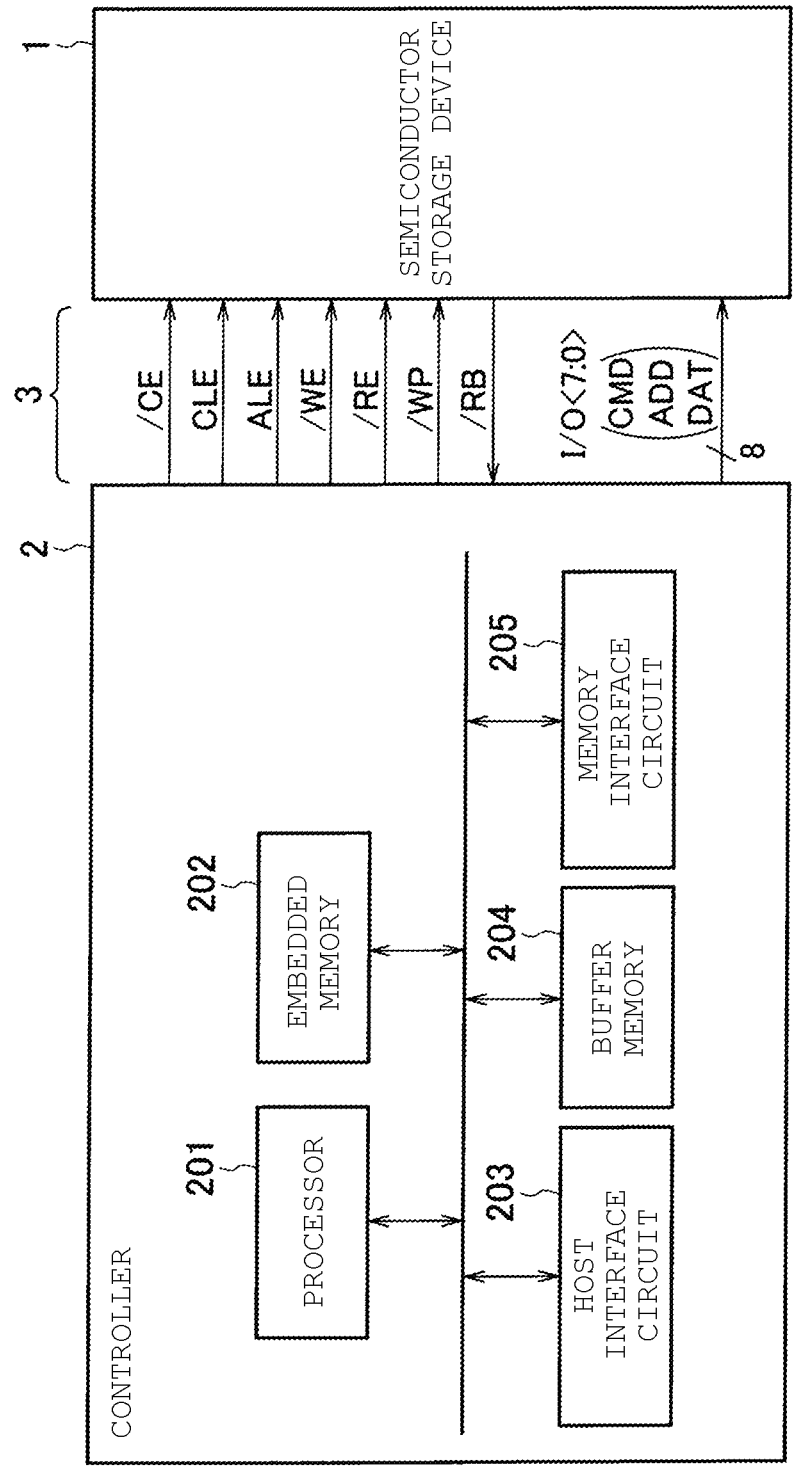
FIG. 19 is a schematic diagram illustrating an example of a memory system.

FIG. 19 illustrates an example of a memory system including the semiconductor storage device 1 and a controller 2 that controls the semiconductor storage device 1. The memory system illustrated in FIG. 19 stores data instructed to be written by a host device (not illustrated), and transmits the data to the host device.

The controller 2 receives a command from the host device and controls the semiconductor storage device 1 based upon the received command. Specifically, the controller 2 writes the data instructed to be written by the host device to the semiconductor storage device 1, reads data instructed to be read by the host device from the semiconductor storage device 1, and transmits the read data to the host device. The controller 2 designates the memory cell transistor MT to be written of the semiconductor storage device 1.

The semiconductor storage device 1 and the controller 2 perform transmission and reception for each of the signals /CE, CLE, ALE, /WE, /RE, /WP, /RB, and I/O <7:0> according to the interface standard of the semiconductor storage device 1 and the controller 2 via individual signal lines of a bus 3. The signal/CE is a signal for enabling the semiconductor storage device 1. The signal CLE notifies the semiconductor storage device 1 that the signal I/O <7:0> transmitted to the semiconductor storage device 1 while the signal CLE is at a high (H) level is a command. The signal ALE notifies the semiconductor storage device 1 that the signal I/O <7:0> transmitted to the semiconductor storage device 1 while the signal ALE is at the H level is an address. The signal/WE instructs the semiconductor storage device 1 to fetch the signal I/O <7:0> transmitted to the semiconductor storage device 1 while the signal/WE is at a low (L) level. The signal/RE instructs the semiconductor storage device 1 to output the signal I/O <7:0>. The signal /WP instructs the semiconductor storage device 1 to prohibit data writing. The signal/RB indicates whether the semiconductor storage device 1 is in a ready state (a state in which the command is received from the outside) or in a busy state (a state in which the command is not received from the outside). The signal I/O <7:0> is, for example, an 8-bit signal. The signal I/O <7:0> is data transmitted and received between the semiconductor storage device 1 and the controller 2, and includes a command CMD, an address ADD, and data DAT. The data DAT includes write data and read data.

The semiconductor storage device 1 is controlled by the controller 2. The controller 2 includes a processor 201, an embedded memory 202, a host interface circuit 203, a buffer memory 204, and a memory interface circuit 205.

The processor 201 controls the whole operation of the controller 2. The processor 201 issues, for example, a read command to the semiconductor storage device 1 in response to a data read command received from the host device. The operation is also the same for writing. The processor 201 has a function of executing various calculations on the read data from the semiconductor storage device 1.

The embedded memory 202 is, for example, a semiconductor memory such as a dynamic random access memory (DRAM) and is used as a work area of the processor 201. The embedded memory 202 stores firmware for managing the semiconductor storage device 1 and various management tables.

The host interface circuit 203 is connected to the host device and executes processing according to the interface standard with the host device. For example, the host interface circuit 203 respectively transfers the command and data received from the host device to the processor 201 and the buffer memory 204.

The buffer memory 204 temporarily stores the data received from the semiconductor storage device 1 and the host device by the controller 2. For example, the buffer memory 204 is also used as a storage region for temporarily storing the read data from the semiconductor storage device 1 and a calculation result with respect to the read data.

The memory interface circuit 205 is connected to the semiconductor storage device 1 via the bus 3, and executes communication with the semiconductor storage device 1. The memory interface circuit 205 transmits the commands CMD, the address ADD, and the write data to the semiconductor storage device 1 according to the command of the processor 201. The memory interface circuit 205 receives the read data from the semiconductor storage device 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
a memory cell array including a plurality of memory strings and a bit line connected to the memory strings, each of the memory strings including a first memory cell transistor and a second memory transistor connected in series, each of the first memory cell transistor and the second memory transistor including a gate electrode and a channel region adjacent the gate electrode, wherein each of the first memory cell transistor and the second memory cell transistor has a threshold voltage changeable through a charge stored between the gate electrode and the channel region; and
a circuit configured to write data into the second memory cell transistor by applying a breakdown voltage to cause dielectric breakdown between the gate electrode and the channel region, wherein
the memory cell array includes a first word line and a second word line, the first word line being connected to the first memory cell transistor, the second word line being connected to the second memory cell transistor, and
the circuit is further configured to read the data of the second memory cell transistor, during which a predetermined voltage is applied to the second word line, the first word line is put in a floating state, and a predetermined voltage is applied to the bit line.

2. The semiconductor storage device according to claim 1, wherein
a voltage value of the breakdown voltage is larger than a withstand voltage present between the gate electrode and the channel region.

3. The semiconductor storage device according to claim 1, wherein
a voltage value of the breakdown voltage is smaller than that of a withstand voltage present between the gate electrode and the channel region, and
an applying duration of the breakdown voltage corresponds to an amount of thermal energy required to cause the dielectric breakdown to occur.

4. The semiconductor storage device according to claim 1, wherein
each of the memory strings includes a select transistor and a select gate line connected to the select transistor, and wherein the select transistor is connected to the second memory cell transistor.

5. The semiconductor storage device according to claim 4, wherein
the plurality of memory strings are disposed in a matrix shape.

6. The semiconductor storage device according to claim 5, wherein
for each of the plurality of memory strings, the breakdown voltage is applied to no more than one memory cell transistor.

7. A semiconductor storage device 7, comprising:
a memory cell array includes a plurality of memory strings, each of the plurality of memory strings includes a plurality of memory cell transistors and a select transistor connected to each other in series, the select transistor being configured to select the plurality of memory cell transistors, each of the memory cell transistors including a gate electrode and a channel region adjacent the gate electrode; and
a circuit configured to write the memory cell transistor by applying a breakdown voltage to cause dielectric breakdown between the gate electrode and the channel region, wherein
each of the memory strings includes:
a columnar semiconductor including the channel region,
a gate insulating film including a charge storage layer disposed around a side surface of the columnar semiconductor, and
a plurality of electrode layers corresponding to the gate electrode of the memory cell transistor, disposed around the gate insulating film and spaced apart from each other along a central axis direction of the columnar semiconductor, wherein the breakdown voltage is applied to one of the electrode layers corresponding to the gate electrode of the memory cell transistor to be written.

8. A method, comprising:

writing a memory cell transistor of a memory cell array by applying a breakdown voltage to cause dielectric breakdown between a gate electrode and a channel region of the memory cell transistor, wherein the memory cell transistor has a threshold voltage changeable through a charge stored between the gate electrode and the channel region, wherein the memory cell transistor is an electrically rewritable non-volatile semiconductor storage element, and wherein each of the memory strings includes:
- a columnar semiconductor including the channel region,
- a gate insulating film including a charge storage layer disposed around a side surface of the columnar semiconductor, and
- a plurality of electrode layers corresponding to the gate electrode of the memory cell transistor, disposed around the gate insulating film and spaced apart from each other along a central axis direction of the columnar semiconductor, wherein the breakdown voltage is applied to one of the electrode layers corresponding to the gate electrode of the memory cell transistor to be written.

9. The method according to claim 8, wherein the memory cell array includes a plurality of memory strings, each of the plurality of memory strings includes a plurality of the memory cell transistors and a select transistor connected to each other in series, the select transistor being configured to select the plurality of memory cell transistors, and wherein the plurality of memory strings are disposed in a matrix shape.

10. The method according to claim 9, wherein for each of the plurality of memory strings, the breakdown voltage is applied to no more than one memory cell transistor.

* * * * *